US008115575B2

(12) United States Patent
Hsu et al.

(10) Patent No.: US 8,115,575 B2
(45) Date of Patent: Feb. 14, 2012

(54) ACTIVE INDUCTOR FOR ASIC APPLICATION

(75) Inventors: Louis Lu-Chen Hsu, Fishkill, NY (US); Jong-Ru Guo, Wappingers Falls, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 12/191,519

(22) Filed: Aug. 14, 2008

(65) Prior Publication Data

US 2010/0039191 A1 Feb. 18, 2010

(51) Int. Cl.
*H03H 11/00* (2006.01)
(52) U.S. Cl. ....................................................... 333/214
(58) Field of Classification Search .................. 333/213, 333/214, 215, 216, 217
See application file for complete search history.

(56) References Cited

U.S. PATENT DOCUMENTS

| | | | | |
|---|---|---|---|---|
| 5,202,655 | A | * | 4/1993 | Hara ............................... 333/215 |
| 6,028,496 | A | * | 2/2000 | Ko et al. ........................ 333/214 |
| 6,261,894 | B1 | | 7/2001 | Mandelman et al. |
| 6,734,767 | B2 | * | 5/2004 | Vanoverschelde et al. ... 333/214 |
| 6,737,944 | B2 | | 5/2004 | Kunikiyo |
| 7,049,888 | B2 | | 5/2006 | Soda |
| 7,129,130 | B2 | | 10/2006 | Adkisson et al. |
| 2007/0257748 | A1 | * | 11/2007 | Kawai ............................. 333/214 |

OTHER PUBLICATIONS

Millman, "Microelectronics", 1979, McGraw-Hill, pp. 237, 254.*
K.H. Chiang, et al., titled "A Modular Approach for High Q Microwave CMOS Active Inductor Design" published in the Proceedings of the 7th IEEE International Conference on Electronics, Circuits and Systems, vol. 1, pp. 41-44, (c) 2000.

* cited by examiner

*Primary Examiner* — Robert Pascal
*Assistant Examiner* — Alan Wong
(74) *Attorney, Agent, or Firm* — H. Daniel Schnurmann

(57) ABSTRACT

An apparatus and method for manufacturing low-cost high-density compact active inductor module using existing DRAM, SRAM and logic process integration. The elements of the active inductor modules are formed by three semiconductor devices including nMOS devices, deep-trench capacitors and a polysilicon or TaN resistor. The active inductor modules can be connected in a parallel and/or serial configuration to obtain a wide range of inductance values. The modular active inductors can be advantageously stored in an ASIC library to facilitate a flexible and convenient circuit design.

13 Claims, 10 Drawing Sheets

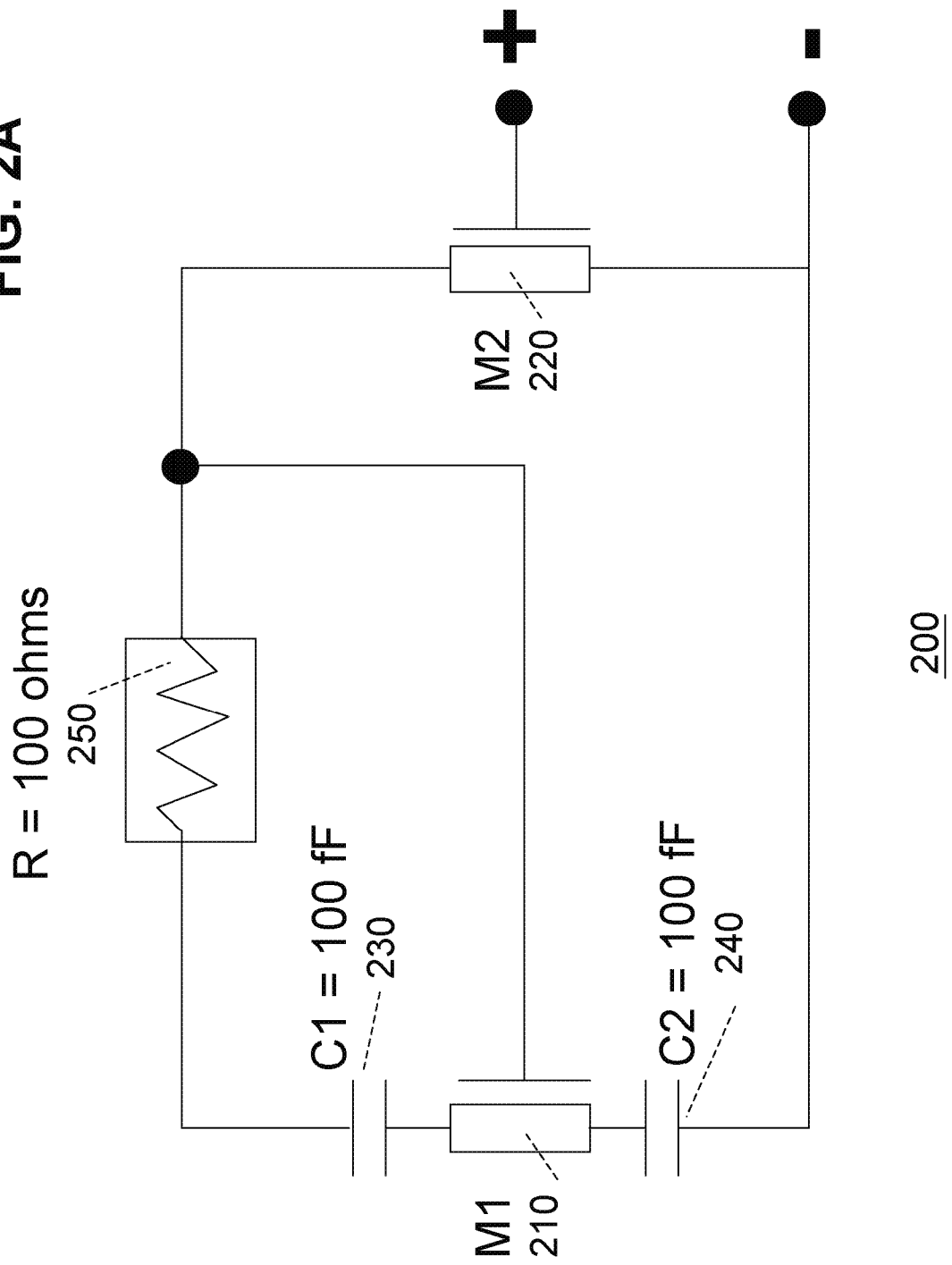

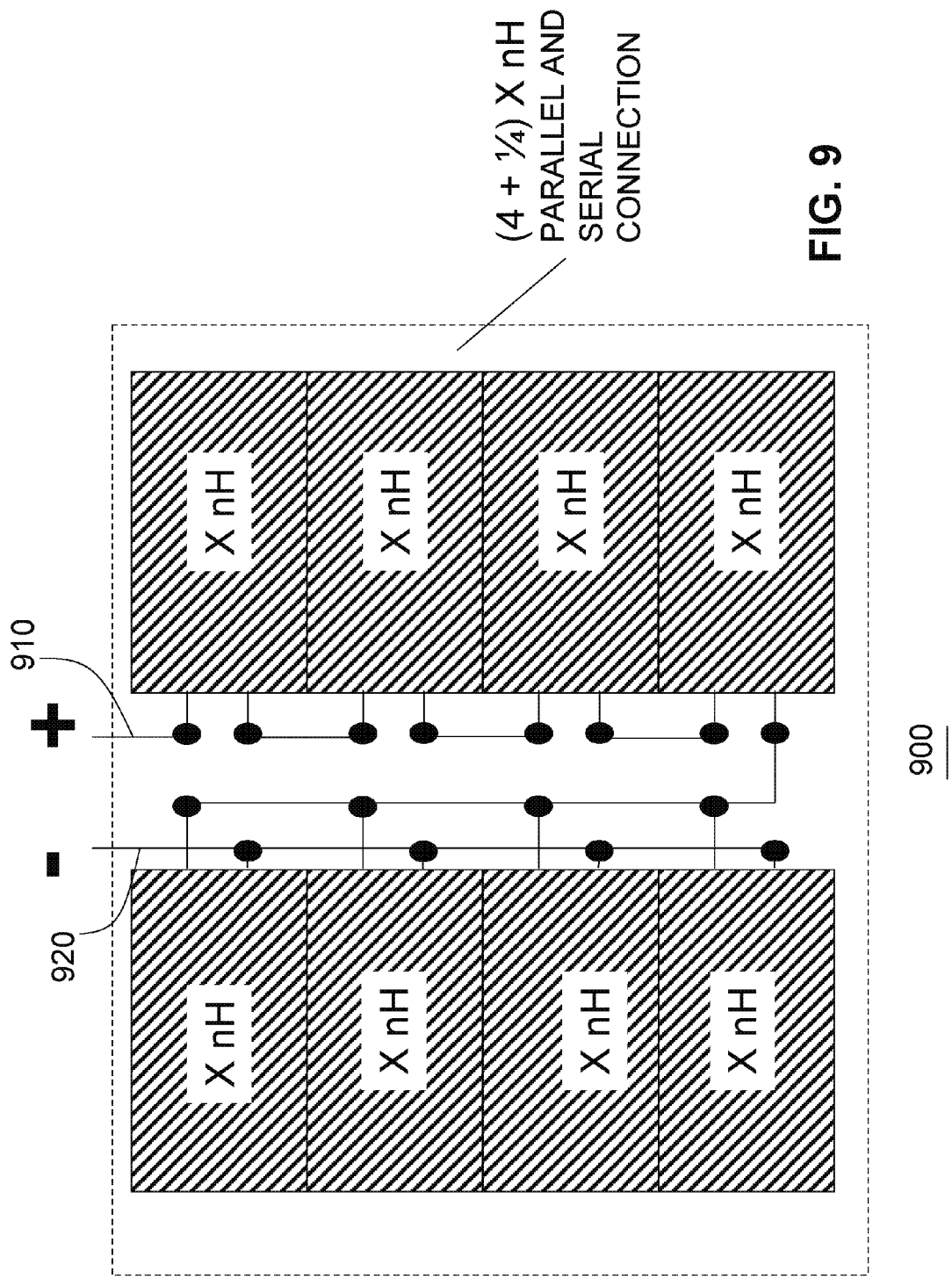

ACTIVE INDUCTOR FOR ASIC APPLICATION

FIELD OF THE INVENTION

The present invention generally relates to semiconductor circuit and devices, and more particularly to a modular active inductor having a high inductance over a wide bandwidth, and high quality factor Q.

BACKGROUND OF THE INVENTION

Inductances have been widely used in the semiconductor chip technology with the intent of extending the amplification band and compensating transmission characteristics in high-speed communication circuits. However, a conventional on-chip inductor fabricated using metal wiring layers, such as passive spiral inductors, not only requires large real estate and consumes high power, but has relatively low quality factor Q due to undesirable resonance caused by parasitics existing in a CMOS substrate. As a result, the cost to fabricate a conventional inductor is high due to the increased chip size. Recently, active inductors (AI) have been applied to substitute passive spiral inductor in some CMOS RF circuits because of their miniaturized size, lower power consumption, less cross-talk, lower cost, higher Q, and fabrication processes that is fully compatible with base CMOS technologies. In general, an active inductor is a CMOS circuit having inductor-like output impedance, and consists of active CMOS transistors, resistors and capacitors. Such devices have found wide application in CMOS RF circuits, such as MMIC, RF filter, matching network, LC circuits, and the like.

In U.S. Pat. No. 7,049,888 issued to Masaaki Soda, a CMOS circuit is described having output voltage and current characteristics equivalent to those of an inductor. Since active inductors are significantly smaller in size than conventional spiral inductors of equivalent inductance value, the circuit size decreases significantly.

Another illustrative example is reported by K. H. Chiang, et al., in a paper titled "A Modular Approach for High Q Microwave CMOS Active Inductor Design" published in the Proceedings of the $7^{th}$ IEEE International Conference on Electronics, Circuits and Systems, vol. 1, pp. 41-44. Therein, a modular approach to an L-band CMOS Active Inductor is described and is designed based on a series of conventional low Q-factor gyrator-C basic modules. In the design, the inductor elements are connected in a serial arrangement, as stated in the aforementioned paper: "when the modular series connection changes from N=1 to 3, the value of Q-factor can be tuned from 11.8 to 972." In order words, the serial connection is mainly intended to boost Q even though its total inductance does not increase monotonically with the number of modular active inductors. The design, however, is not intended for connecting AI elements in parallel or in series, and displays a behavior similar to conventional inductive elements.

In today's ASIC environment of designing highly integrated chips, such as SOC, high-speed I/Os and/or analog communication macros, inductors having various sizes are often needed. The RF industry has a particular interest in inductors with array or modular configuration which gives designers much needed flexibility to optimize circuit performance over a wide range of applications and frequencies, while keeping at the same time the circuitry at a minimum size and cost. One can, of course, build many active inductor circuits of various sizes to meet this requirement, but the drawback is that each circuit has to be characterized and individually tuned to obtain the correct inductance value. At the end, the size of the circuit and the cost for tuning becomes impractical.

In related prior art U.S. Pat. No. 6,737,944 issued to Kunikiyo, there is described an active inductor formed by two field effect transistors, having the drain of the first field effect transistor coupled to the source of the second field effect transistor, the gate of the first field effect transistor coupled to the drain of the second field effect transistor with no active element interposed therebetween. The active inductor also includes a feedback path between the source of the first field effect transistor and the gate of the second field effect transistor. The gate and source of the second field-effect transistor serve as two ports of the active inductor. The AI described is mainly intended to reduce the series resistance component of the inductor to reduce power consumption, minimize the loss and provide the inductance over a wide bandwidth.

Generally, conventional AIs tend to gravitate toward a customized design, i.e., a design tailored to create an inductor having a specific Q value.

The manufacture references of the proposed active inductor structure are prior art embedded-DRAM (eDRAM) on either bulk silicon substrates or SOI (silicon-on-insulator) substrates. For example, bulk eDRAM processes have been described, e.g., in U.S. Pat. No. 6,261,894 issued to Mandelman et al., and in a Conference report titled "Device Equivalent of Logic Performance in 0.18 um and Extension to 0.13 um Embedded DRAM Technology", published in the Proceedings of the International Symposium on VLSI Technology, System, and Application (2001). Another example of a prior art fabrication of an SOI eDRAM is described in U.S. Pat. No. 7,129,130, issued to Adkisson et al. All of the aforementioned eDRAMs disclose active device processes and structures with an integrated deep-trench capacitor in close vicinity which can be applied to the active inductor.

OBJECTS AND SUMMARY OF EMBODIMENTS OF THE INVENTION

Accordingly, it is an object of the invention to provide a compact modular active inductor (MAI) which can be constructed using existing low cost, well-developed CMOS process integration techniques applicable to eDRAM and SRAM devices.

It is another object of the invention to optimize the utilization of the modular active inductor, wherein MAIs are arranged in an array configuration, with serial, parallel or combinations thereof to obtain a wide range of inductances.

It is still another object to provide an active inductor module consisting of a minimum number of MOSFET devices, capacitors and resistor, and characterized by having a high quality factor Q and low parasitic resistance.

It is a further object to provide an MAI that is easily tunable and which can be adapted to a large variety of design applications.

These and other objectives are achieved in one embodiment of the present invention by an active inductor module with a circuit formed by only two MOSFET devices, two capacitors and one resistor, which can easily utilize known integration processes to fabricate all of the necessary components that are fully compatible with well-known semiconductor manufacturing. Specifically, the active inductor module is characterized by having higher inductance over a wide bandwidth, a significantly higher Q value and lower parasitic resistance, in addition to the use of deep-trench (DT) capacitors and polysilicon resistors to minimize the size of active inductor module of the present invention.

The modular active inductor (MAI) further enables a flexible design, wherein the active inductor modules can be connected in series and/or in parallel to create a wide range of inductance values. This design can then be incorporated as standard modules in an ASIC library. Moreover, the ASIC library provides a variety of AI modules with different sizes and shapes. The user can easily select any module to link the active inductors in a parallel configuration, in series or in a combination thereof to yield at least one inductor with a targeted value.

One embodiment of the invention provides an active inductor module consisting of two conventional MOS devices, two groups of deep-trench capacitors and a polysilicon resistor compactly arranged in a miniaturized module area.

Another embodiment of the invention provides an active inductor that includes: a first and second nMOS devices respectively having a source, drain and gate, first and second capacitors, and a resistor, the gate of the first nMOS device is connected to the drain of the second nMOS device, the drain of the first nMOS device is coupled to the drain of the second nMOS device through the first capacitor in series with the resistor, and the source of the first nMOS device is coupled to the source of the second nMOS device through the second capacitor.

In still another embodiment of the invention, there is provided an arrangement of a plurality of active inductors to form an inductor configuration with a reduced inductance; wherein all positive ports of the plurality of active inductors are connected to a common positive port, and all the negative ports of the plurality of active inductors are connected to a common negative port, each of said active inductors consisting of a first and second nMOS devices respectively having a source, drain and gate, first and second capacitors, and a resistor, the gate of the first nMOS device is connected to the drain of the second nMOS device, the drain of the first nMOS device is coupled to the drain of the second nMOS device through a combination of the first capacitor in series with the resistor, and the source of the first nMOS device is coupled to the source of the second nMOS device through the second capacitor, and wherein the common positive port and the common negative port are, respectively, the positive port and the negative port of the plurality of the active inductors forming the inductor configuration.

In yet another embodiment of the invention, there is provided compact a circuit of the active inductor implemented in a pMOS configuration. Shown therein are the gate of the pMOS device M1 directly attached to the source of the pMOS device M2, and the drain of the first pMOS device M1 coupled to the drain of the second pMOS device M2 through the capacitor C2. The active inductor module further includes a feedback path linking the respective sources of the first and second pMOS devices M1 and M2 through the first capacitor C1 in series with resistor R. The positive and negative ports of the active inductor module are respectively formed by the gate and source of the second pMOS device M2.

As previously discussed, none of the prior art active inductors describe a Modular Active Inductor (MAI) having a flexible and configurable architecture for a plurality of identical active inductor modules connected in series or in parallel. Neither does the prior art discloses a fabrication process of a tightly-spaced modular active inductor configuration, each module having an identical inductance value. Moreover, the prior art fails to provide inductive devices and configurations thereof that lend themselves to be catalogued in an ASIC library and which require to maintain only few modules to meet a large gamut of applications. Furthermore, the prior art fails to demonstrate an effective way to layout a plurality of active inductor circuits, as well as a manufacturable process to prevent a mismatch between a pair of the active inductor circuits. The prior art does not describe how to take advantage of fully developed DRAM and SRAM integration techniques to form the active inductor circuit so that each component in the circuit, such as MOS devices, capacitors, resistors, etc. are well under control. Furthermore, such MAI device would require being scalable with technology.

BRIEF DESCRIPTION OF THE DRAWINGS

The above and other objects, features and advantages of the present invention will become more fully understood from the detailed description given hereinbelow and the accompanying drawings, which are given by way of illustration only and thus are not to be considered as limiting the present invention.

FIGS. 2A and 2B show illustrative schematics of a compact circuit for the active inductor module, according to an embodiment of the present invention, wherein The FIG. 2A shows the aforementioned circuit in an nMOS Active Inductor configuration, and FIG. 2B depicts the circuit in a pMOS configuration;

FIG. 9 illustrates the schematic modular layout design with mixed parallel and serial connections of the active inductor modules, according to a further embodiment of the invention.

DETAILED DESCRIPTION

Figure 1:
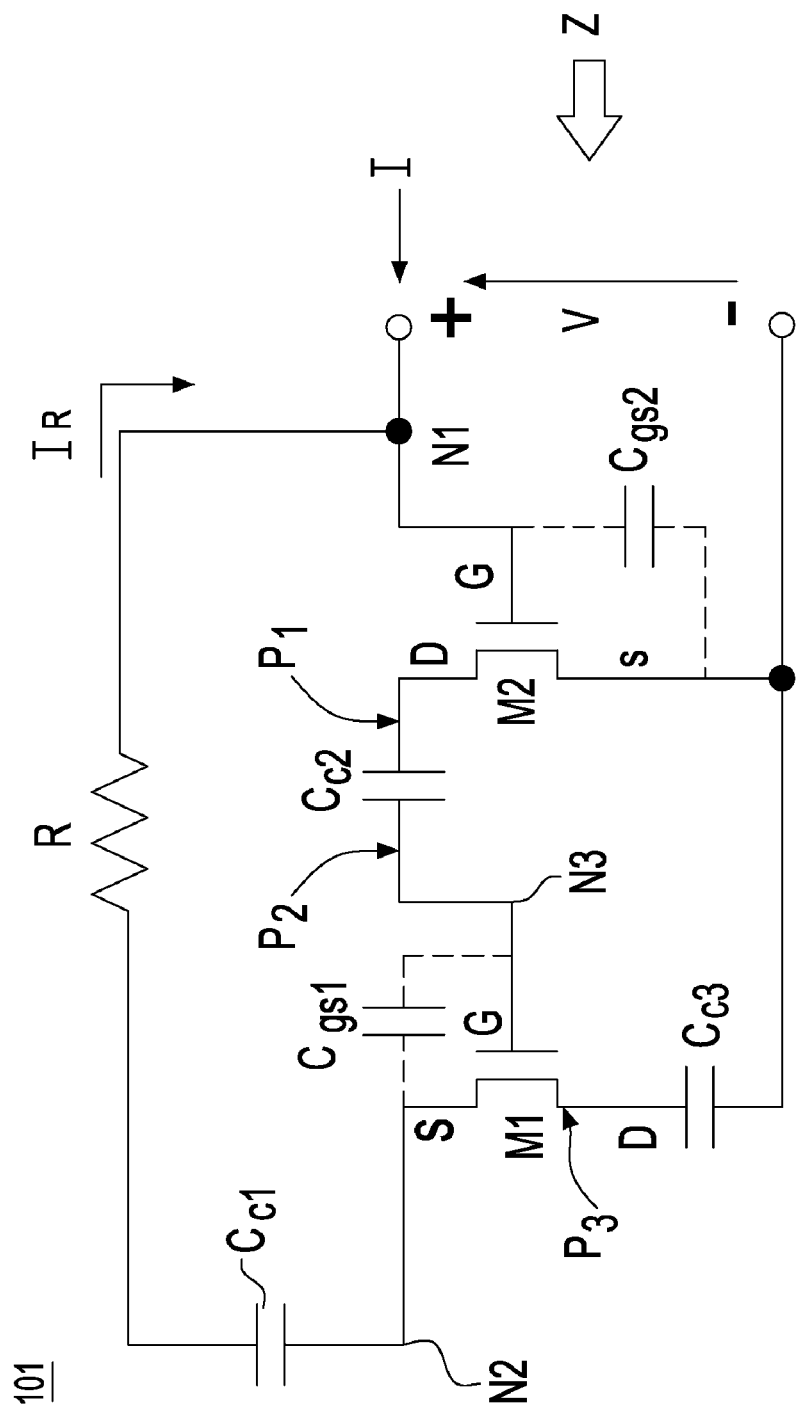
FIG. 1 shows a prior art active inductive circuit.

The active inductor will now be discussed in greater detail by referring to the drawings that accompany the present application. In the accompanying drawings, like and corresponding parts are referred to by like reference numbers. For clarity, the drawings are not drawn to scale.

Referring to FIG. 2A, a compact active inductor module 200 according to one embodiment of the present invention is formed by first and second nMOS devices, M1 (210) and M2 (220) respectively; first and second capacitors, C1 (230) and C2 (240) respectively, and resistor R (250).

In the compact circuit of one embodiment of the present invention, the gate of M1 device is coupled to the drain of the M2 device. Unlike the circuit shown in prior art FIG. 1, and the source of the first nMOS device M1 is coupled to the source of the second nMOS device M2 via second capacitor C2. The active inductor module further includes a feedback path linking the respective drains of the first and second nMOS devices M1 and M2 through the first capacitor C1 and resistor R. The positive and negative ports of the active inductor module are respectively formed by the gate and source of the second nMOS device M2.

By way of example, the capacitance of capacitors C1 and C2 is preferably 100 fF, and more generally, in the range of 100 fF to 1 pF, while the resistance of resistor R is preferably 100 ohms, with a range between 50 ohms and 1000 ohms.

Figure 2B:
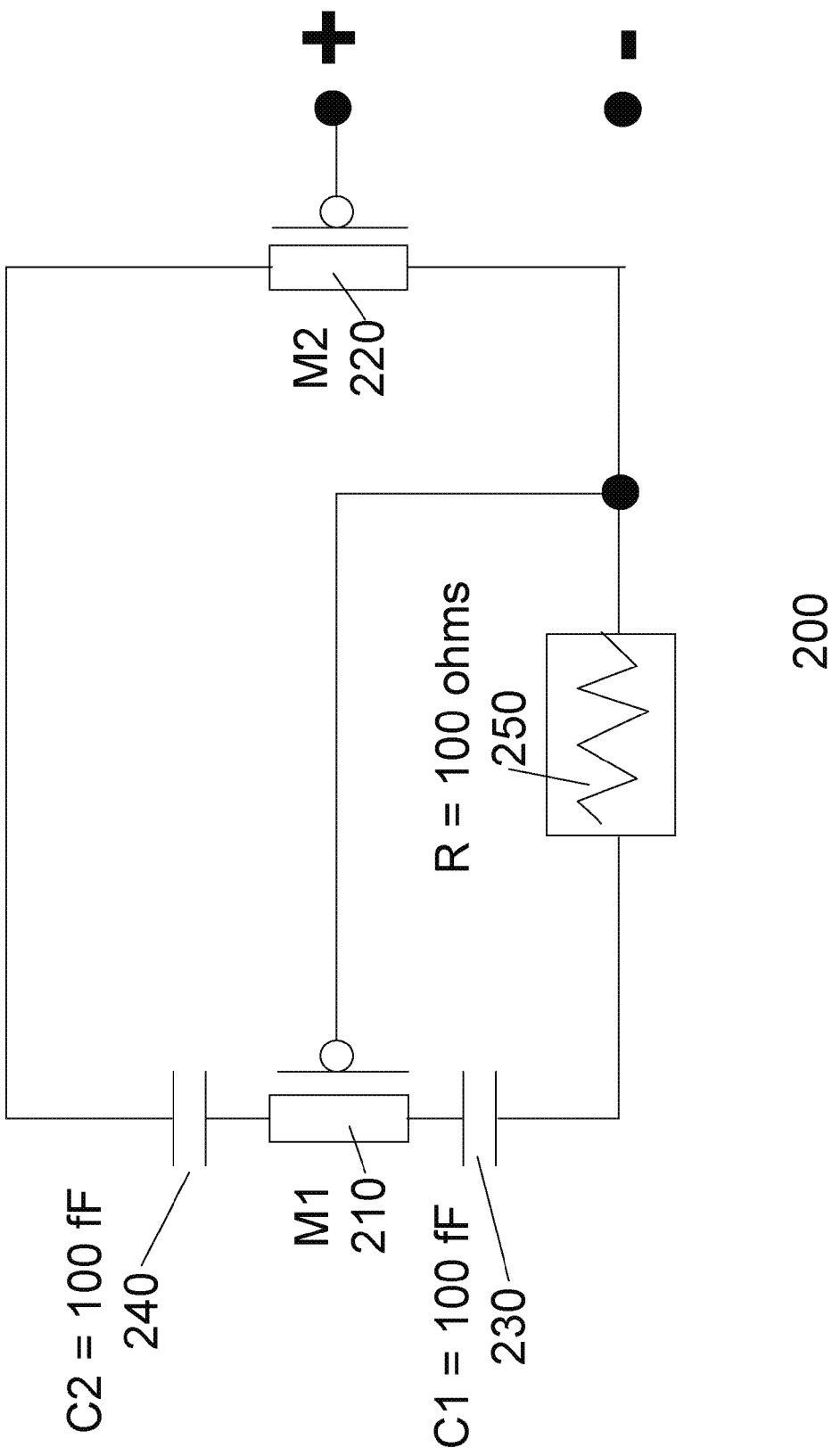

Referring to FIG. 2B, there is shown the compact circuit of the active inductor implemented in a pMOS configuration. Shown therein are the gate of the pMOS device M1 directly attached to the source of the pMOS device M2, and the drain of the first pMOS device M1 coupled to the drain of the second pMOS device M2 through the capacitor C2. The active inductor module further includes a feedback path linking the respective sources of the first and second pMOS devices M1 and M2 through the first capacitor C1 in series with resistor R. The positive and negative ports of the active inductor module are respectively formed by the gate and source of the second pMOS device M2.

Figure 3:
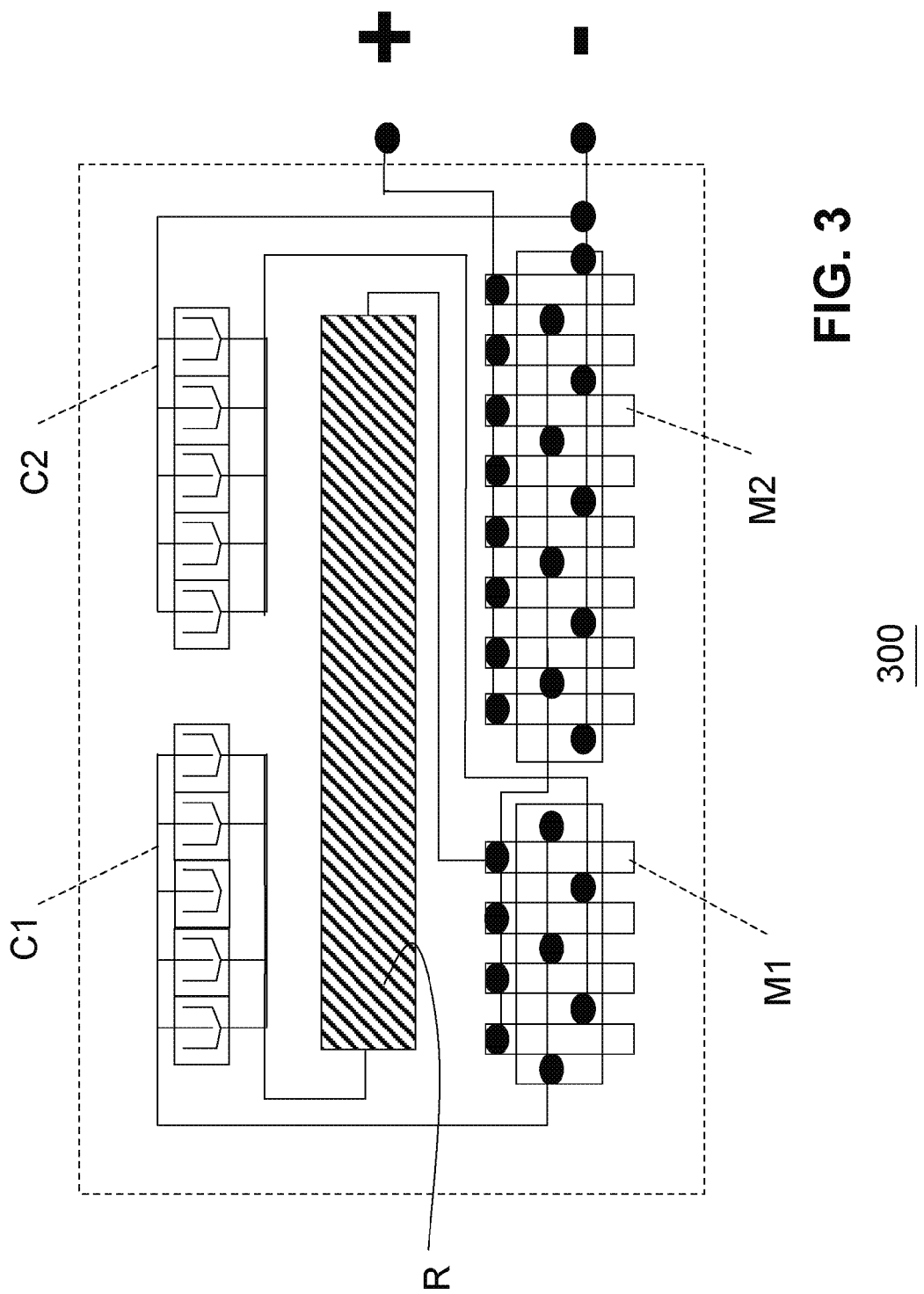
FIG. 3 shows a schematic top view of a physical layout design of the active inductor module shown in FIGS. 2A-2B.

Referring to FIG. 3, there is shown a top-down view of a physical layout of an active inductor module 300, wherein the miniaturized circuit components are placed in a compact arrangement over a small area on the IC chip. For illustrative purposes, multi-finger structures are advantageously used for the nFET devices M1 and M2, wherein a single long gate strip is divided into a group of small gate strips in parallel for more efficient and flexible layout design. The resistive element R is preferably an on-chip resistor made of polysilicon and back-end-of-line (BEOL) TaN, and more specifically, of n+ or p+ polysilicon. Parallel deep-trench (DT) capacitors are used to form the capacitors C1 and C2 in the module. DT or stacked capacitors replace traditional plate capacitors, significantly reducing the size of the active inductor module, which enables forming an array configuration at reasonable quantities to construct the modular active inductor for a large number of possible applications. Preferably, the capacitor nodes should be isolated from each other.

Figure 4:
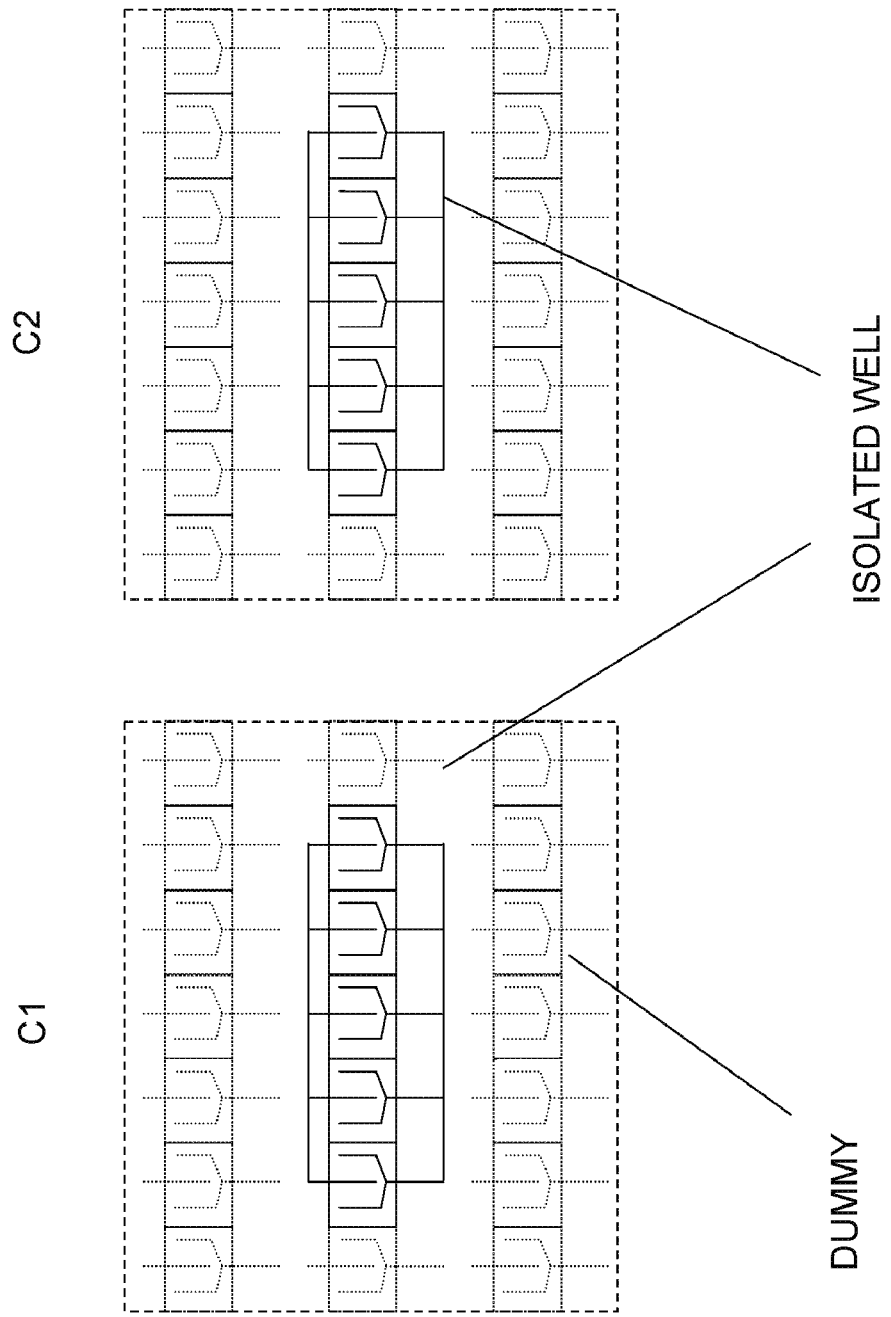
FIG. 4 illustrates an arrangement of the deep-trench capacitors used in one embodiment of the compact active inductor module of the present invention.

FIG. 4 illustrates an arrangement of the deep-trench capacitors C1 and C2 of the compact active inductor module according to one embodiment of the present invention. A plurality of DT capacitors linked in parallel to one another provides the required capacitance value for C1 and C2. Preferably, additional rows of dummy deep-trenches are placed around the functional capacitors C1 and C2 maintaining the same pitch to form an array environment so that edge distortion can be avoided when fabricating the tightly-spaced DT capacitors to obtain the desired C1 and C2 capacitances. Furthermore, capacitors C1 and C2 are advantageously separated from one another by placing them in their respective isolated wells.

With the compact circuit components and arrangement, the size of the inventive active inductor module can be significantly reduced. Taking, for instance, prior art FIG. 1, a capacitance of 100 fF for DT capacitors C1 and C2 and a resistance of 100 ohms for polysilicon resistor R creates a structure having a module area estimated to be preferably, approximately 4 $\mu m^2$ for some of the latest technologies, such that the miniaturized active inductor module of the present invention makes it possible to form compact array configurations consisting of serial and/or parallel configurations.

Figure 5:
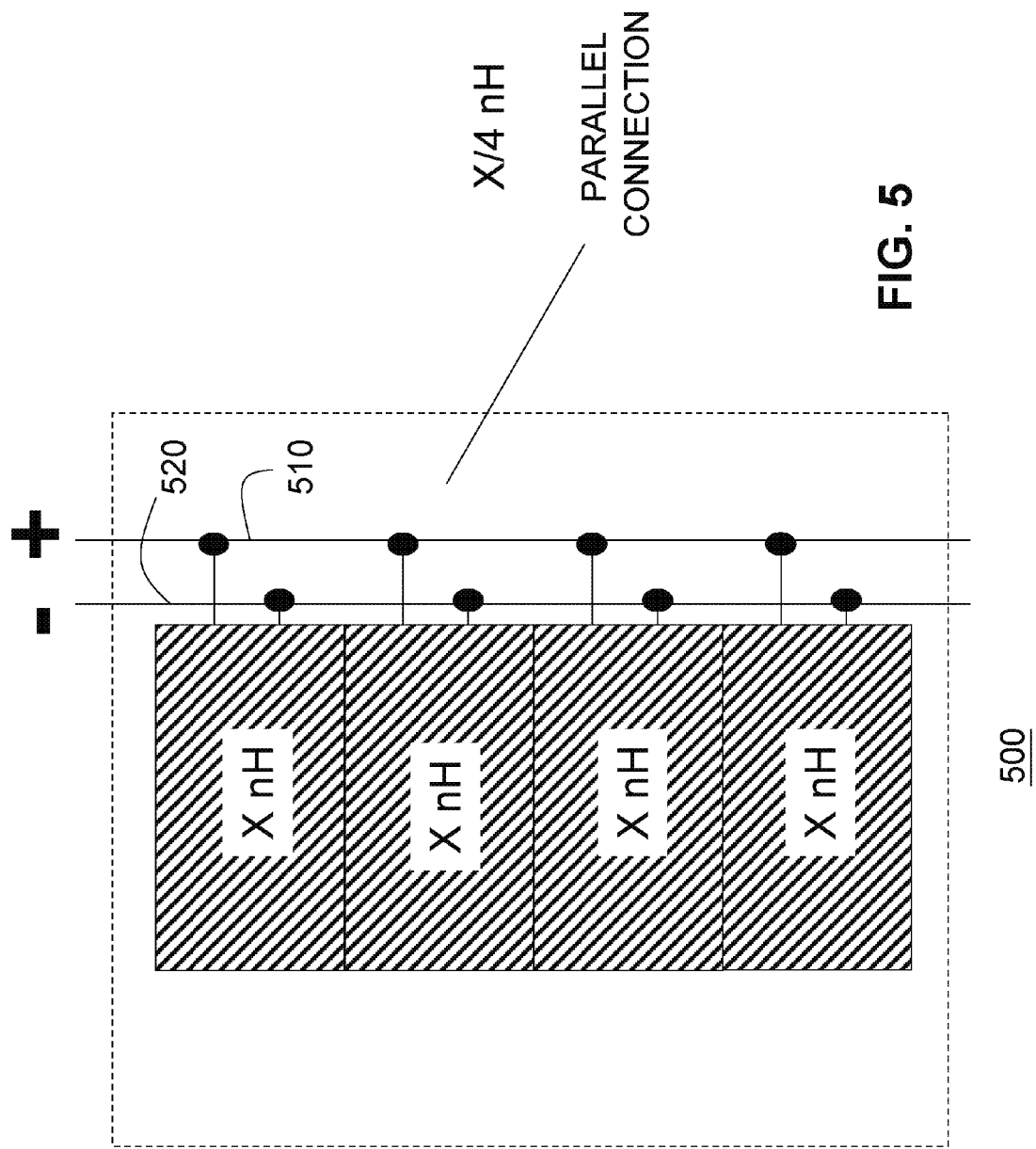
FIG. 5 illustrates another embodiment of a schematic of a modular layout design with a parallel configuration of the modular active inductor.

FIG. 5 illustrates a demonstrative parallel connection of four identical active inductor modules, each of the modules having an inductance of X nH. Within this modular inductor (500), the positive ports of all the four modules are connected to the common positive port (510), while all the negative ports of the modules are attached to the common negative port (520). This parallel configuration results in a reduced modular inductance of approximately (X/4) nH.

Figure 6:
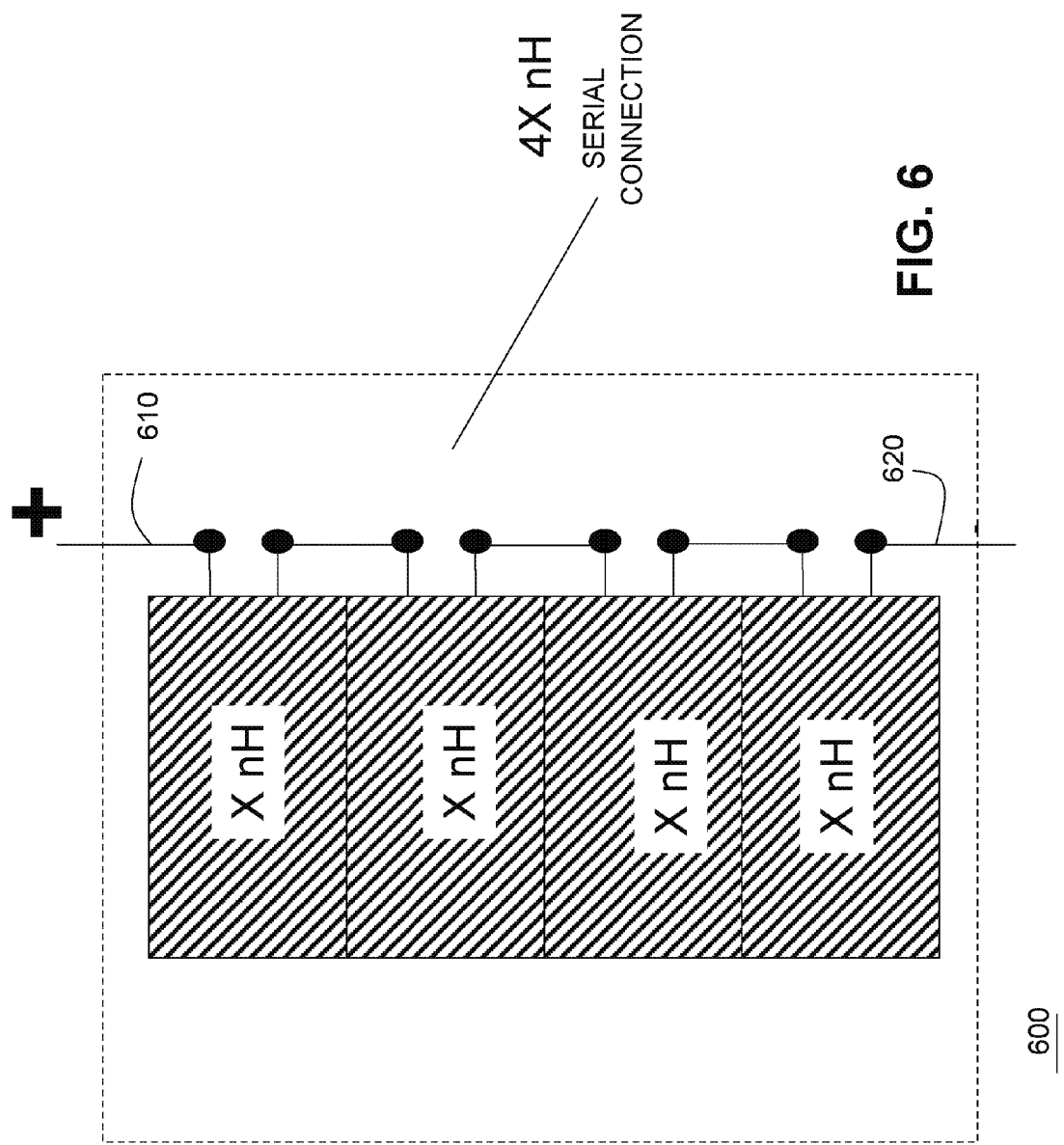
FIG. 6 illustrates the schematic modular layout design in a serial connection of the modular active inductors, according to an embodiment of the invention.

Referring to FIG. 6, an illustrative serial connection of four identical active inductor modules is shown, each of the modules having an inductance of X nH. Within modular inductor (600), the positive port of one module is linked to the negative port of the next module in series. As a result, the positive port of the first module serves as the positive port (610) of the modular inductor while the negative port of the last module serves as the negative port (620) of the modular inductor. Such serial configuration results in an increased modular inductance of approximately 4× nH.

To demonstrate the feasibility of the active inductor module shown in FIG. 2 and the modular active inductor parallel configuration illustrated in FIG. 5, a serial arrangement thereof is depicted in FIG. 6. Various circuit simulations have been conducted to evaluate the effect of serial and parallel connections on the net inductance, the results of which are shown with reference to FIGS. 7A-7B.

Figure 7B:
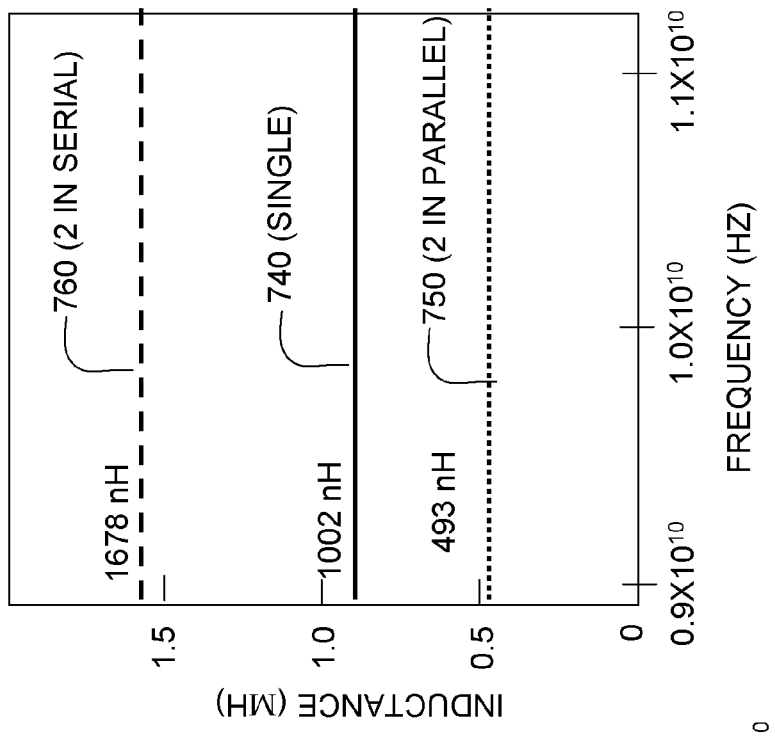
FIGS. 7A and 7B show the simulated inductances of an individual active inductor module, as well as those of active inductor modules with parallel and serial connections, respectively.
Figure 7A:
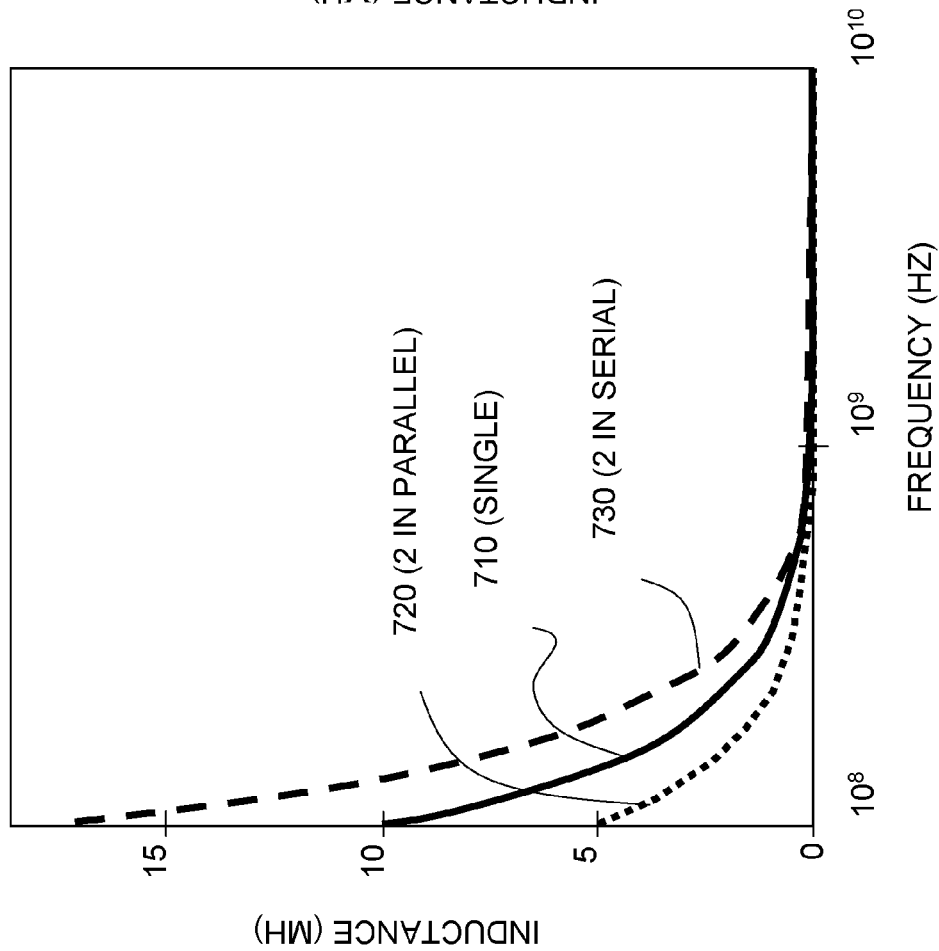

FIG. 7A shows the simulation results for a frequency range between 100 MHz and 10 GHz. The simulated inductance value is plotted against a range of signal frequencies for a single active inductor module (710); two modules connected in parallel (720); and two modules connected in series (730). Generally, as one would expect, the parallel connection yields a lower inductance than the single module, while the serial connection gives a higher inductance than the single module.

For a more quantitative comparison, FIG. 7B shows the detailed values at a frequency around 10 GHz, where one can observe that the simulated inductance is 1002 nH for a single active inductor module (740), 493 nH for two modules with parallel connection (750), and 1678 nH for two modules with serial connection (760). The results shown demonstrate the functionality of the disclosed compact active inductor module as well as the effect of parallel/serial connections on the net inductance of the inventive modular active inductor. However, it is worth noting that the net inductance does not increase linearly with the number of modules in a serial connection. Therefore, it is important to provide a model curve for ASIC applications in order for circuit designers to take advantage of the library.

Figure 8:
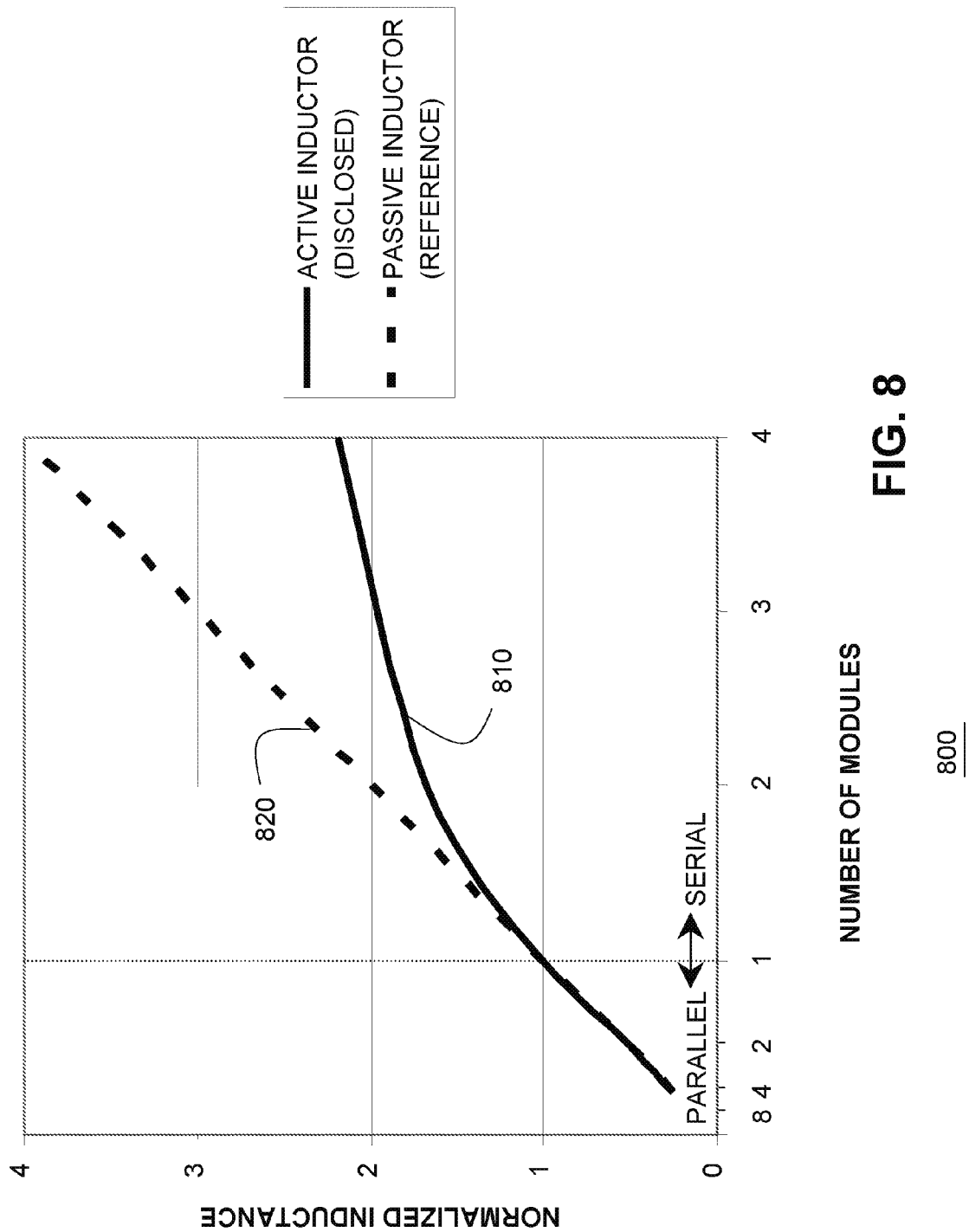
FIG. 8 shows a simulated total inductance curve as a function of the module active inductor configuration.

FIG. 8 shows the simulated model curve for a modular active inductor (810) according to embodiment of the present invention. In FIG. 8, the total inductance is normalized to the value of the single module and plotted against the number of modules in both a serial and a parallel configuration. It can be observed that the modular inductance increases monotonically, although not linearly, with the number of active inductor modules in serial connection; while the net inductance decreases with the number of modules in parallel connection. For comparison purpose, also shown in FIG. 8 is the reference line (820) expected for an ideal passive inductor. By referencing this model curve, circuit designers can easily determine the modular configuration for the required application.

The modular active inductor (MAI) can be extended to a variety of combinations of parallel and serial connections in order to reach a predetermined target value.

Referring to FIG. 9, there is shown an illustrative example of configurations (900), wherein a serial modular inductor with an inductance of approximately 4× nH is serially connected to a parallel modular inductor with an inductance of approximately (X/4) nH. The resulting composite modular inductor has a net inductance of approximately (4×+X/4) nH, wherein the positive port of the entire modular inductor (910) is the positive port of the serial module, while the negative port of the modular inductor (920) is the negative port of the parallel module. The net inductance value can be designed with relatively high accuracy by carefully choosing the proper combination of serial and parallel configurations.

Based on these aforementioned examples, one can readily realize that the modular active inductor can be used to greatly facilitate circuit designs. By offering modular active inductors with a wide range of inductance as standard modules in ASIC libraries, as well as providing the associated model curve for the modular inductance, designers can conveniently choose the proper configurations and combinations to satisfy the circuit requirement with high accuracy.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An active inductor comprising first and second nMOS devices, said first and second nMOS devices respectively having a source, a drain and a gate, first and second capacitors, and a resistor; wherein the gate of the first nMOS device is attached to the drain of the second nMOS device, the drain of the first nMOS device is coupled to the drain of the second nMOS device through the first capacitor and the resistor, and the source of the first nMOS device is coupled to the source of the second nMOS device through the second capacitor.

2. The active inductor as recited in claim 1 wherein the drain of the first nMOS device coupled to the drain of the second nMOS device through the first capacitor connected in series to the resistor form a feedback path.

3. The active inductor as recited in claim 1 further comprising positive and negative ports formed, respectively, by the gate and source of the second nMOS device.

4. The active inductor as recited in claim 1 wherein the first and second capacitors respectively have a capacitance ranging from 100 fF to 1 pF, and the resistor has a resistance ranging from 50 ohms to 1000 ohms.

5. The active inductor as recited in claim 1, wherein said first and second nMOS devices, first and second capacitors and said resistors are formed by CMOS, DRAM, or SRAM process integration techniques.

6. The active inductor as recited in claim 1, wherein said first and second capacitors are deep-trench capacitors.

7. The active inductor as recited in claim 1, wherein said first and second capacitors are stack capacitors.

8. The active inductor as recited in claim 1, wherein said first and second capacitors are MOS capacitors.

9. The active inductor as recited in claim 1, wherein said first and second capacitors are electrically isolated from one another.

10. The active inductor as recited in claim 1, wherein said first and second capacitors are respectively formed in a first isolated well and in a second isolated well.

11. The active inductor as recited in claim 1, wherein said resistor is a polysilicon resistor.

12. The active inductor as recited in claim 1, wherein said resistor is a back-end-of-line silicide resistor or a TaN resistor.

13. A parallel arrangement of a plurality of active inductors to form an inductor configuration having a reduced inductance wherein positive ports of the plurality of active inductors are connected to a common positive port, and negative ports of the plurality of active inductors are connected to a common negative port, each of said active inductors comprising a first and second nMOS devices respectively having a source, drain and gate, first and second capacitors, and a resistor, the gate of the first nMOS device is connected to the drain of the second nMOS device, the drains of the first and second nMOS are coupled to each others through the first capacitor in series with the resistor, and the source of the first nMOS device is coupled to the source of the second nMOS device through the second capacitor, and wherein the common positive port and the common negative port are, respectively, the positive port and the negative port of the plurality of the active inductors form the inductor configuration.

* * * * *